US009922945B2

(12) United States Patent
Ziglioli et al.

(10) Patent No.: US 9,922,945 B2
(45) Date of Patent: Mar. 20, 2018

(54) METHODS, CIRCUITS AND SYSTEMS FOR A PACKAGE STRUCTURE HAVING WIRELESS LATERAL CONNECTIONS

(71) Applicant: STMicroelectronics S.r.l., Agrate Brianza (IT)

(72) Inventors: Federico Giovanni Ziglioli, Pozzo D'Adda (IT); Alberto Pagani, Nova Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 52 days.

(21) Appl. No.: 14/815,527

(22) Filed: Jul. 31, 2015

(65) Prior Publication Data
US 2015/0357294 A1    Dec. 10, 2015

Related U.S. Application Data

(63) Continuation of application No. 13/919,536, filed on Jun. 17, 2013, now Pat. No. 9,099,453.

(30) Foreign Application Priority Data

Jun. 15, 2012  (IT) ............................... VI2012A0145

(51) Int. Cl.
*H01L 23/64*   (2006.01)
*H01L 49/02*   (2006.01)
(Continued)

(52) U.S. Cl.
CPC .......... *H01L 23/642* (2013.01); *H01L 21/441* (2013.01); *H01L 21/50* (2013.01);
(Continued)

(58) Field of Classification Search
CPC ............. H01L 23/522; H01L 23/49551; H01L 23/5385; H01L 23/49575; H01L 23/49537;
(Continued)

(56) References Cited

U.S. PATENT DOCUMENTS 7,292,050 B1 * 11/2007 Chow .................... H01L 23/48
324/681
7,923,290 B2    4/2011 Ko et al.
(Continued)

FOREIGN PATENT DOCUMENTS

EP    0 617 467 A2    9/1994
EP    0 862 213 A2    9/1998
(Continued)

OTHER PUBLICATIONS

Italian Search Report dated Mar. 13, 2013, for corresponding IT Application No. VI20120145, 4 pages.

*Primary Examiner* — Benjamin Sandvik
*Assistant Examiner* — Farid Khan
(74) *Attorney, Agent, or Firm* — Seed IP Law Group LLP

(57) ABSTRACT

A packaged semiconductor device includes a communication pad formed in a side surface, which is operatively coupled to a communication circuit so as to enable the establishing of a wireless communication channel to an adjacently positioned packaged semiconductor device. The communication pad may be formed upon cutting a block including the packaged semiconductor device and an appropriately positioned and dimensioned conductor.

19 Claims, 10 Drawing Sheets

(51) Int. Cl.
*H01L 21/441* (2006.01)
*H01L 21/768* (2006.01)
*H01L 23/48* (2006.01)
*H01L 23/495* (2006.01)
*H01L 23/498* (2006.01)
*H01L 25/10* (2006.01)
*H01L 21/50* (2006.01)
*H01L 23/538* (2006.01)
*H01L 23/31* (2006.01)
*H01L 21/56* (2006.01)
*H01L 23/00* (2006.01)

(52) U.S. Cl.
CPC ............ *H01L 21/768* (2013.01); *H01L 23/48* (2013.01); *H01L 23/49537* (2013.01); *H01L 23/49551* (2013.01); *H01L 23/49575* (2013.01); *H01L 23/49805* (2013.01); *H01L 23/5385* (2013.01); *H01L 24/97* (2013.01); *H01L 25/105* (2013.01); *H01L 28/40* (2013.01); *H01L 21/561* (2013.01); *H01L 23/3128* (2013.01); *H01L 23/49822* (2013.01); *H01L 24/29* (2013.01); *H01L 24/32* (2013.01); *H01L 24/48* (2013.01); *H01L 24/49* (2013.01); *H01L 2224/2919* (2013.01); *H01L 2224/32245* (2013.01); *H01L 2224/48091* (2013.01); *H01L 2224/48247* (2013.01); *H01L 2224/48465* (2013.01); *H01L 2224/49109* (2013.01); *H01L 2224/73265* (2013.01); *H01L 2224/97* (2013.01); *H01L 2924/00014* (2013.01); *H01L 2924/181* (2013.01)

(58) Field of Classification Search
CPC ... H01L 23/48; H01L 23/49805; H01L 24/97; H01L 25/105; H01L 23/5222; H01L 23/642; H01L 21/441; H01L 28/40
See application file for complete search history.

(56) References Cited

U.S. PATENT DOCUMENTS

| | | | | |
|---|---|---|---|---|
| 7,947,529 | B2* | 5/2011 | Koon | H01L 23/3107 257/E21.499 |
| 8,169,058 | B2 | 5/2012 | Pagaila et al. | |
| 8,211,746 | B2 | 7/2012 | Ha et al. | |
| 8,445,790 | B2 | 5/2013 | Lee et al. | |
| 8,455,954 | B2 | 6/2013 | Suzuki et al. | |
| 2002/0006503 | A1 | 1/2002 | Watanabe et al. | |
| 2002/0064029 | A1 | 5/2002 | Pohjonen | |
| 2002/0075106 | A1 | 6/2002 | Okubora et al. | |
| 2004/0113271 | A1* | 6/2004 | Takahashi | H01L 23/49572 257/735 |
| 2006/0125042 | A1 | 6/2006 | Fuergut et al. | |
| 2007/0043894 | A1* | 2/2007 | Zingher | H01L 23/48 710/310 |
| 2007/0105304 | A1 | 5/2007 | Kasai et al. | |
| 2007/0181989 | A1* | 8/2007 | Corisis | H01L 21/561 257/686 |
| 2007/0278701 | A1* | 12/2007 | Chang | H01L 21/481 257/787 |
| 2008/0017966 | A1 | 1/2008 | Williams et al. | |
| 2008/0061801 | A1* | 3/2008 | Chow | G01R 27/26 324/681 |
| 2008/0099896 | A1* | 5/2008 | Shen | H01L 23/49531 257/676 |
| 2008/0142941 | A1 | 6/2008 | Yew et al. | |
| 2009/0032960 | A1* | 2/2009 | Pratt | H01L 21/76898 257/773 |
| 2009/0085233 | A1* | 4/2009 | Krishnamoorthy | H01L 23/48 257/797 |
| 2009/0175008 | A1 | 7/2009 | Rosenblatt et al. | |
| 2009/0194887 | A1 | 8/2009 | Liu et al. | |
| 2010/0078790 | A1 | 4/2010 | Ito et al. | |
| 2010/0213606 | A1* | 8/2010 | Krishnamoorthy | H01L 23/66 257/702 |
| 2011/0006443 | A1 | 1/2011 | Noguchi et al. | |
| 2011/0024904 | A1 | 2/2011 | Egawa | |
| 2011/0227206 | A1 | 9/2011 | Ha et al. | |
| 2011/0248310 | A1* | 10/2011 | Cheng | H01L 21/76898 257/99 |
| 2011/0272781 | A1 | 11/2011 | Tada et al. | |
| 2011/0272820 | A1* | 11/2011 | Lee | H01L 21/561 257/774 |
| 2012/0061827 | A1* | 3/2012 | Fujita | H01L 21/30655 257/737 |
| 2012/0091570 | A1* | 4/2012 | Pan | H01L 21/568 257/676 |
| 2012/0091575 | A1* | 4/2012 | Lai | H01L 23/48 257/737 |
| 2012/0313233 | A1* | 12/2012 | Boo | H01L 23/3107 257/676 |
| 2013/0037309 | A1* | 2/2013 | Kim | H01L 21/6835 174/251 |
| 2013/0099006 | A1 | 4/2013 | Hong et al. | |
| 2013/0241025 | A1* | 9/2013 | Pagani | H01L 21/768 257/499 |
| 2013/0277803 | A1 | 10/2013 | Pagani | |
| 2014/0268612 | A1 | 9/2014 | Zhang et al. | |

FOREIGN PATENT DOCUMENTS

| | | |
|---|---|---|
| EP | 1 667 227 A1 | 6/2006 |
| EP | 1 724 835 A1 | 11/2006 |
| WO | 2007/079121 A2 | 7/2007 |

* cited by examiner

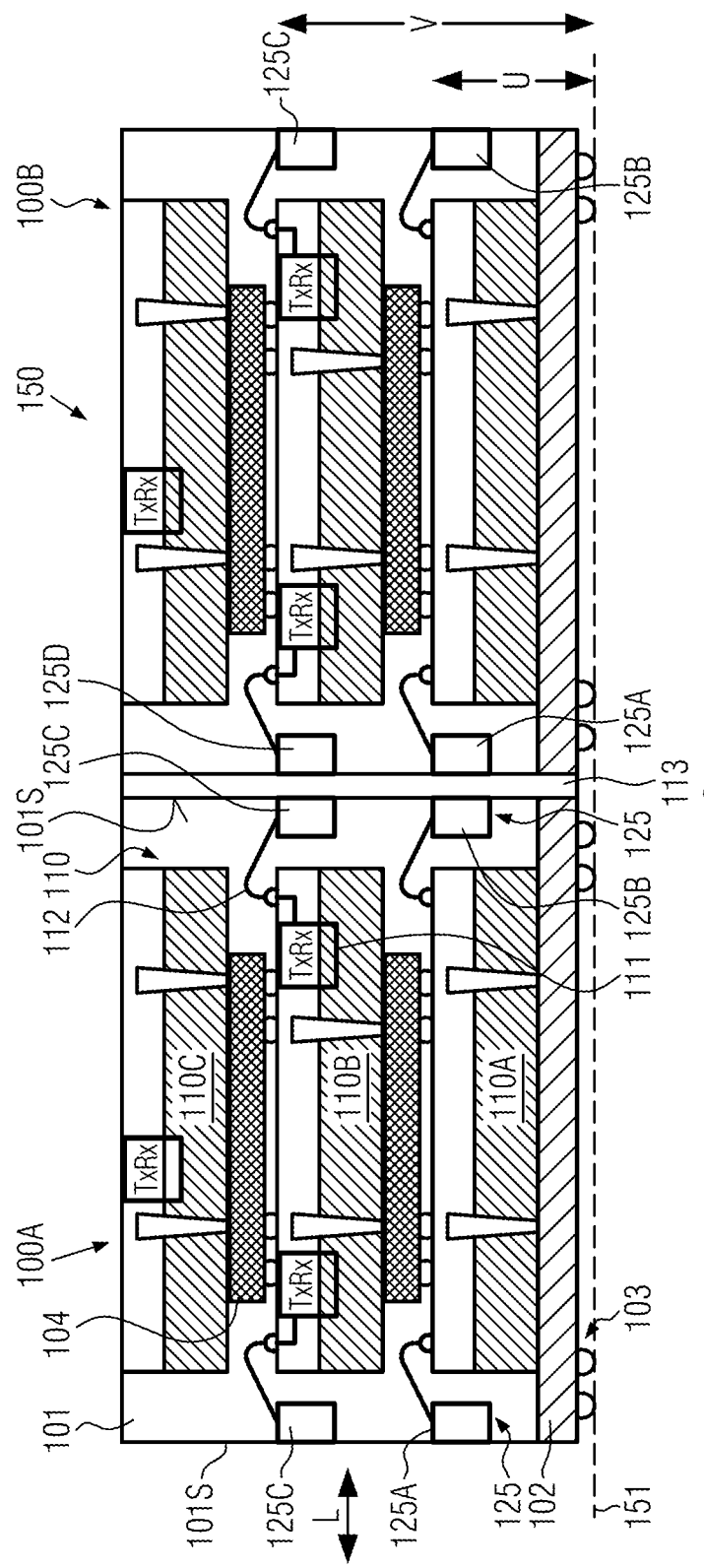

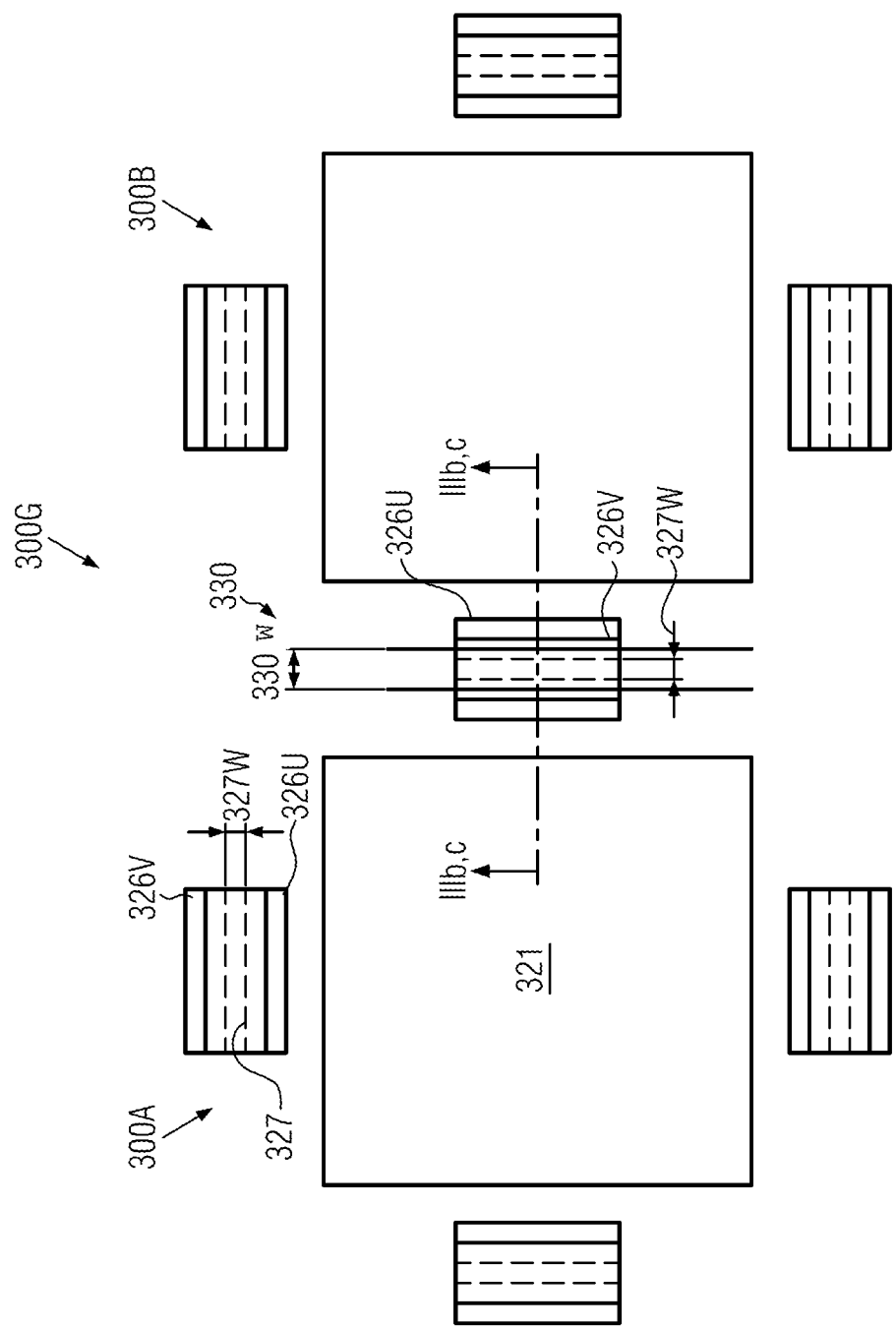

METHODS, CIRCUITS AND SYSTEMS FOR A PACKAGE STRUCTURE HAVING WIRELESS LATERAL CONNECTIONS

PRIORITY CLAIM

The instant application claims priority to U.S. patent application Ser. No. 13/919,536, filed Jun. 17, 2013, which claims priority to Italian Patent Application No. VI2012A000145, filed Jun. 15, 2012, which are incorporated herein by reference in their entirety.

BACKGROUND

Technical Field

Generally, an embodiment relates to packaging and assembly processes of electronic systems including one or more integrated circuits (ICs).

Description of the Related Art

Immense progress has been made in the field of semiconductor production techniques by steadily reducing the critical dimensions of circuit elements, such as transistors, in highly complex integrated circuits. For example, critical dimensions of 30 nm and less have been implemented in highly complex logic circuitry and memory devices, thereby achieving high packing density. Consequently, more and more functions may be integrated into a single semiconductor chip, thereby providing the possibility of forming entire systems on chip so that highly complex electronic circuits may be formed on the basis of a common manufacturing process.

Typically, upon increasing the complexity of an integrated circuit provided on a single semiconductor chip, the input/output (IO) capabilities are also increased in order to address the demands for communication with peripheral circuitry in complex electronic systems. Typically, a semiconductor chip is attached to an appropriate substrate or package, which may impart superior thermal and mechanical integrity to the sensitive semiconductor chip and which may also represent an appropriate interface so as to provide an electrical connection from the integrated circuit to a peripheral electronic component, such as a printed circuit board (PCB), which in turn may have any appropriate configuration so as to represent a part of an overall complex electronic system. Frequently used contact technologies for coupling the semiconductor chip with a package include wire bonding or direct electrical connection of appropriately designed contact structures provided on the semiconductor chip and the package substrate. For example, in the case of direct contact regimes, solder balls, solder bumps, contact pads, or any other appropriate contact elements in the form of metal pillars, and the like, may be provided in appropriate metallization systems of the semiconductor chip and the package in order to establish a reliable electrical and mechanical connection upon attaching the semiconductor chip to the package substrate.

Although the packing density of complex integrated circuits has been significantly increased due to the reduction of the critical dimensions as discussed above, the volumetric packing density of packages has not been increased in a similar proportion, since for higher complexity of the integrated circuits, in which basically a two-dimensional complex arrangement of circuit elements is provided, a corresponding highly complex routing system is typically required in the package so as to finally appropriately couple to a PCB in order to combine the various components of a complex electronic system. In order to increase the volumetric packing density of a package, it has been proposed to provide three-dimensional chip systems, in which two or more semiconductor chips may be provided in a stacked configuration within a single package, thereby significantly increasing the volumetric packing density for a given footprint of the package.

The three-dimensional configuration of the semiconductor chips, however, may require appropriate routing strategies in order to establish electric communication between the individual electronic circuits provided in the various semiconductor chips. Furthermore, generally the complexity of the routing arrangement in the package may also increase in order to provide the required input/output capabilities for coupling the package to other components, such as other packages and external electronic components of the electronic system under consideration. As is well-known, a general electronic system is coupled to the outside world by means of connections/wired channels, such as cables or wires, optical fibers, etc., or by means of wireless channels of an electromagnetic type. Such connections allow for exchanging information signals or supplying power/energy.

At the lowest level of an electronic system, connections of circuit elements within a single semiconductor chip are established by providing conductive lines and an appropriate metallization system including vertical connections, or vias, and horizontal metal lines, where in complex integrated circuits a plurality of metallization layers are stacked in order to provide the electrical connections between the individual circuit elements. The interconnection of the one or more semiconductor chips with a package is typically accomplished by providing appropriately dimensioned and positioned contact pads, for instance, at the last metallization layer of the metallization system of a semiconductor chip, and implementing a wiring system in the package, for instance a contact structure or bond pads that may be coupled to the contact pads of the one or more semiconductor chips. The connections may typically be established on the basis of conductors or metal traces formed in the dielectric material of the package, for instance in or on respective dielectric substrates, within the mold material that typically includes and protects the various components in the package, and the like. Finally, a package contact structure, for instance provided in the form of solder pads, and the like, enables the coupling to an external component, such as a PCB of an electronic system. Typically, the connection to the PCB is achieved at the bottom surface of the package at which the package contact structure is provided.

Due to the increasing complexity of electronic systems, there is a continuous drive in reducing the overall dimensions, for instance of the package of semiconductor devices, in order to increase the total packing density. That is, great efforts are being made in reducing the overall dimensions of the packaged semiconductor device while still providing the required input/output resources so as to couple to the PCB of the electronic system.

For example, U.S. Pat. No. 7,923,290 B2, which is incorporated by reference, is directed to manufacturing techniques that address the demands for increased miniaturization of components, greater packaging density of integrated circuits, superior performance, and reduced costs for complex electronic devices, in particular with respect to portable information and communication devices, such as cellular phones, personal data assistants, camcorders, notebook computers, and the like. For example, a configuration of the type PoP (Package on Package) is suggested and, thus, the area occupied by the package is dominated by the chip with the largest dimensions. The presence of the support structure increases the dimensions of the package. Moreover, in this concept all interconnections are finally rooted to the bottom surface of the lower package for being coupled to a PCB. Furthermore, the routing within the semiconductor chip is implemented on the basis of a TSV (through-silicon via) approach of the "via last" type, which, thus, entails the formation of the vias through the entire IC.

With respect to enhancing packaging of a plurality of semiconductor chips, US Patent Publication 2009/0194887 A1, which is incorporated by reference, discloses a multiple chip package, in which basically two chips are packaged individually, wherein the corresponding packages are appropriately designed so as to allow efficient coupling on the basis of solder bumps, thereby forming a stacked package configuration.

US Patent Publication 2008/0142941 A1, which is incorporated by reference, describes a three-dimensional electronic packaging structure with enhanced grounding performance and embedded antenna, wherein the various packaged semiconductor devices are coupled to each other by means of a corresponding contact structure coupling a bottom surface of one packaged device with the top surface of a further packaged semiconductor device.

US Patent Publication 2011/0024904 A11, which is incorporated by reference, relates to semiconductor packages and to a package-on-package semiconductor device, in which the stacking of packaged semiconductor devices may be enhanced by providing an appropriate electrode unit embedded in the mold material of each of the packages.

US Patent Publication 2011/0227206 A1, which is incorporated by reference, discloses a packaging system with a lead frame for a semiconductor device, wherein a base device in the form of a semiconductor chip is attached to a base substrate, followed by the attachment of a lead frame having a lead-frame pillar adjacent to the semiconductor device. Thereafter, a mold material is applied and partially removed together with a portion of the lead frame in order to partially expose the lead-frame pillar. Also in this case the packaging is enhanced in the vertical direction of the finally obtained package.

Thus, current packaging architectures may be limited due to the fact that the connectivity of the ICs and the package develops in the vertical direction and also the connectivity between packages generally tends to increase in the vertical direction. Indeed, all interconnections are brought to the bottom surface of the package for being coupled to a PCB and, when necessary, some of the interconnections are also routed to the top surface for being coupled to an upper package (PoP).

In other packaging strategies, it is attempted to reduce the lateral area by providing a wiring system in the form of a "lead frame" formed by well-established plating techniques on a permanent or sacrificial substrate, thereby enabling the fabrication of a plurality of contact pads at reduced size and superior accuracy, which in turn may result in increased input/output resources for a given available bottom surface or top surface of a corresponding package. Furthermore, in these manufacturing techniques, a plurality of package substrates may be formed in a single manufacturing process as a continuous block of a plurality of packages, which may be separated after having received the corresponding semiconductor chips and after coupling the chips to the contact pads of the packages.

Consequently, connectivity in the packaging tends to develop generally in a vertical direction, whereas in the PCBs the connectivity tends to increase in complexity in a horizontal direction.

BRIEF SUMMARY

Therefore, an embodiment includes means for enhancing connectivity of packaged semiconductor devices.

Generally, an embodiment includes packaged semiconductor devices, electronic systems, and methods for packaging an integrated-circuit chip, wherein lateral connectivity between packaged semiconductor devices is realized on the basis of wireless signal exchange. In this manner, complex electronic systems may be provided with increased functionality, substantially without increasing area consumption in the lateral direction. On the other hand, well-established and highly efficient packaging concepts, such as the usage of lead-frame structures, application of plating techniques, and the like may be used, thereby avoiding an increase of complexity of the packaging process or even reducing associated production costs.

An embodiment includes a packaged semiconductor device. The packaged semiconductor device includes an insulating material forming a side surface of the packaged semiconductor device. Moreover, the packaged semiconductor device includes an integrated-circuit chip embedded in the insulating material and including a communication circuit. The packaged semiconductor device further includes a wiring system embedded in the insulating material and electrically coupling the integrated-circuit chip with a plurality of package contact elements. Additionally, the packaged semiconductor device includes a communication pad formed in the side surface and being operatively coupled to the communication circuit so as to enable wireless signal exchange via the communication pad.

According to an embodiment, a packaged semiconductor device is appropriately configured to enable a lateral wireless signal exchange, and thus communication with other components of an electronic system, for instance with a neighboring packaged semiconductor device, without requiring any additional routing complexity in a PCB of the electronic system. According to an embodiment, any well-established packaging contact may be extended in such a manner such that typically the side surface or a plurality of side surfaces of that packaged semiconductor device are available for communication, substantially without contributing to additional complexity within the wiring system within the package. For example, the communication circuit, which may include one or more circuit portions that are appropriately configured to receive or transmit signals to the communication pad, for instance on the basis of a wire-bond connection, and the like, may be positioned within the package at any appropriate location, without consuming valuable chip area. For signal/power, one can use standard bottom pads as well if such pads are available in the structure. Hence, the common location pad may be coupled and operated by a chip internal-metallization system without contributing to additional complexity of the package-internal wiring system. In this manner, well-established contact regimes may be applied so as to couple to a PCB or a further packaged semiconductor device by using the contact structure, for instance formed at a bottom surface or top surface of the packaged semiconductor device. On the other hand, the additional connection of one or more semiconductor chips to the common location pad or to a plurality of common location pads may be implemented on the basis of any appropriate contact regime, such as lead frames, metal traces formed on the basis of well-established deposition techniques, and the like, such that undue complexity of the manufacturing process is avoided, or even reduced.

In a further illustrative embodiment, a packaged semiconductor device further includes a second communication pad formed in the side surface and operatively coupled to the communication circuit so as to be operable independently of the communication pad. In this manner the connectivity of the packaged semiconductor device in the context of a complex electronic system may further be increased, however, without increasing, or even reducing, the overall requirements with respect to connectivity via a bottom surface or a top surface, which may be used to couple to a PCB or a further packaged semiconductor device, when a stacked configuration is considered. In an embodiment, the communication pad and the second communication pad in combination with the communication circuit are configured such that an independent operation is possible, thereby providing for superior communication capabilities or flexibility in arranging the packaged semiconductor device in a complex electronic system. For example, providing two or more communication pads in one or more side surfaces of the packaged semiconductor device may allow the lateral alignment to other packaged semiconductor devices or other components with superior flexibility, since a corresponding complementary communication pad may have a position that depends on the characteristics of the other packaged semiconductor device or component. If, therefore, a single communication channel is to be established, an appropriately positioned communication pad may be selected so as to comply with the position and orientation of a complementary communication pad, while any other "inappropriately" positioned communication pads and corresponding portions of the communication circuit may be deactivated.

In an illustrative embodiment, the communication pad and the second communication pad are arranged at different height levels. Consequently, the number of communication channels or the degree of flexibility in "responding" to a respective position of a complementary communication pad may be enhanced without contributing to an increased lateral size of the packaged semiconductor device.

In an embodiment, the communication pad is a portion of a lead frame. In this manner, well-established packaged structures in the form of an appropriate lead frame may be used, thereby enabling a cost-efficient application of the lead frame, which in turn may give rise to a very efficient provision of the hardware resources required for implementing the communication pad in the packaged semiconductor device.

In a further embodiment, the second communication pad is a portion of a second lead frame positioned above the lead frame. Hence, in such an embodiment, a stacked configuration of the communication pads may efficiently be implemented on the basis of stacked lead frames, which in turn may be formed individually by well-established and cost-efficient manufacturing techniques. For example, lead frames may efficiently be formed by stamping an appropriate sheet of conductive material, wherein the individual conductors of the lead frame are appropriately positioned and dimensioned so as to allow electrical coupling to the communication circuit, for instance by wire bond techniques, while also providing a surface portion of appropriate dimensions, for instance after cutting through the conductive material of the lead frame in order to obtain the communication pad at the side surface of the packaged semiconductor device.

In a further embodiment, the wiring system includes a metal trace extending to the side surface and forming with an end portion thereof the communication pad. In such an embodiment, the package internal wiring system may include at least one appropriately positioned and dimensioned metal trace in order to implement the communication pad. In this manner, the wiring system may be implemented on the basis of any desired manufacturing technique, wherein contrary to conventional concepts, a modified configuration is used in order to implement the at least one metal trace. The at least one metal trace may be coupled to the communication circuit by means of the wiring system, thereby achieving reduced overall complexity. For example, the package internal wiring system may couple to a contact structure of the integrated-circuit chip on the basis of a wire-bond technique, solder-bump technique, or the like, such that upon establishing the package-integrated-circuit-chip connection, also the connection from the communication circuits to the communication pad is established in a single process step. In other cases, the at least one metal trace may also provide an appropriate contact surface for receiving, for instance, a bond wire in order to operatively couple the communication circuit with the communication pad.

In a further embodiment, the communication pad is formed by a surface portion of a via formed in the wiring system so as to couple a first metal trace formed in a first level with a second metal trace formed in a second level. That is, a multi-level wiring system may be implemented on the basis of any desired process technique, wherein basically the cross-sectional area of the via defines the finally obtained dimensions of the communication pad. Consequently, by using well-established deposition techniques for forming multi-level metallization systems, the communication pad may be provided with any desired dimensions with superior process efficiency and accuracy associated with the corresponding deposition technique. It is appreciated that also in this case the wiring system may provide for contact between the communication pads and the communication circuit in the same manufacturing step when establishing other conventional connections within the packaged semiconductor device. In other cases, at least one of the metal traces coupled to the via may be coupled to an appropriate surface area for receiving a bond wire, and the like.

According to a further embodiment, an electronic system includes a first packaged semiconductor device according to any of the above-identified embodiments of the packaged semiconductor device or according to any further embodiments of packaged semiconductor devices, as will be described later on in more detail. The first packaged semiconductor device is attached and electrically coupled via its plurality of package contact elements to a carrier substrate. Moreover, the electronic system includes a second packaged semiconductor device according to any of the above-identified embodiments of packaged semiconductor devices or according to any further packaged semiconductor devices, as will be described later on in more detail. Also, the second packaged semiconductor device is attached and electrically coupled via its plurality of package contact elements to the carrier substrate. The communication pad of the first packaged semiconductor device and the communication pad of the second packaged semiconductor device are aligned to each other so as to enable wireless signal exchange.

As already discussed above, by appropriately aligning the communication pads of the first and second packaged semiconductor devices, at least one wireless communication channel may be established, thereby significantly improving overall connectivity within the electronic system, however, without increasing the overall lateral size, or even reducing the required lateral dimensions, since at least some of the wired connections of a conventional electronic system may be "replaced" by the wireless communication channel. For example, the power supply for the one or more semiconductor chips in the packaged semiconductor devices may be established on the basis of conventional wired connections, for instance by the plurality of contact elements, while most of the package-to-package signal transfer may be established via the wireless communication channel. Furthermore, the electronic system may include other components, which may basically act as an intermediate component for routing any signals from packaged semiconductor devices to the PCB without being restricted to the physical location of a respective packaged semiconductor device. In this manner, the requirements with respect to the horizontal routing in the PCB or carrier substrate of the electronic system may significantly be relaxed, since the actual wired connection may be established at any appropriate position within the electronic system.

Since the communication pads of the packaged semiconductor devices may be provided with a high degree of accuracy with respect to their dimensions and position within the respective side surfaces, a reliable wireless communication channel may be established, for instance, based on capacitive coupling, and the like, wherein even a certain degree of "redundancy" may be taken into consideration so as to accommodate any misalignments when attaching the first and second packaged semiconductor devices to the carrier substrate.

In a further illustrative embodiment, an electronic system further includes a dielectric material formed between the communication pads of the first and second packaged semiconductor devices. In this manner, a precisely defined capacitive coupling may be established between the communication pads, thereby providing for a high degree of reliability of the resulting wireless communication channel.

Still a further embodiment is a method of forming a packaged semiconductor device, the method including forming a block of insulating material or dielectric material having embedded therein an integrated-circuit chip and a wiring system coupled to the integrated-circuit chip, wherein the integrated-circuit chip includes a communication circuit operatively coupled to a conductor extending in the block. The method further includes cutting the block and through the conductor so as to form a side surface of the packaged semiconductor device and to expose a cut surface of the conductor as a communication pad for wireless signal exchange.

One or more embodiments thus enable the fabrication of packaged semiconductor devices in such a manner that during the cutting process the communication pad is formed on the basis of a conductor that is appropriately positioned in the insulating or dielectric material of the packaged semiconductor device. Consequently, upon implementing an appropriate conductor system in the dielectric material, the actual application of the communication pad may not involve additional process steps. On the other hand, since the conductor may be incorporated in the insulating or dielectric material with high precision with respect to position and dimensions of the conductor, also the size and shape of the resulting communication pad may be determined with a high degree of accuracy and reproducibility.

In an illustrative embodiment, the step of forming the block includes providing a lead frame, coupling at least one conductor branch of the lead frame with the communication circuit and embedding the lead frame in a mold material. Hence, well-established packaging concepts based on lead frames may be used, which in turn may be produced with high accuracy and reduced cost.

In a further illustrative embodiment, a method further includes bending the at least one conductor branch so as to adjust a height level of the communication pad. Hence, by a simple mechanical processing of the conductor system of the lead frame, superior flexibility in adjusting a desired height level of the resulting communication pad may be achieved. Furthermore, when providing conductor branches at different height levels, communication pads may also be obtained at different height levels by using a single lead frame.

For example, in an embodiment, a second conductor branch of the lead frame is coupled with the communication circuit and the second conductor branch is used so as to define a second height level for a second communication pad in the side surface.

In a further embodiment, a method further includes positioning at least one further lead frame above the lead frame so as to form a stacked configuration. Hence, any desired number of height levels may be implemented in the packaged semiconductor device, wherein the size and position of a corresponding communication pad in its respective height level may readily be determined on the basis of a single lead frame, substantially without adding additional complexity to the overall manufacturing process. The individual lead frames may be stacked by interposing an appropriate insulating/dielectric material, such as a non-conductive tape, a non-conductive glue, and the like, which may additionally ensure the mechanical stability of the stacked lead frames upon providing an appropriate insulating material, such as a mold material, and the like.

In a further embodiment, a method further includes forming the conductor on a carrier substrate by a plating process. In this manner, well-established deposition techniques, such as electroplating, electroless plating, and the like may be applied upon forming the conductor and an internal wiring system of a package so that even a moderately complex wiring system may be implemented with high production efficiency and at low cost. Furthermore, the carrier substrate may be preserved as a portion of the insulating or dielectric material of the packaged semiconductor device, while in other cases the carrier material may be removed at any appropriate manufacturing stage. In particular, forming the conductor on the basis of well-established deposition techniques may enable the application of the composite blocks of packages, which may afterwards be populated with the corresponding integrated-circuit chips as is typically the case in panel-level packaging techniques (PLP).

In a further embodiment, a conductor is formed so as to have a first lateral extension at a first height level and a second lateral extension at a second height level, wherein the first lateral extension is greater than the second lateral extension. In this manner, a stacked configuration of conductors may be implemented with appropriately dimensioned lateral dimensions in the respective height level so as to allow the various conductors to be contacted, for instance by wire bond, so as to establish a connection with the communication circuit of the integrated-circuit chip.

In a further embodiment, a second lateral extension is less than a width of a cut lane formed in the block when cutting the block and the conductor. In this manner, the portion of the conductor having the reduced width may thus completely be eliminated during the process of separating individual packages from the composite block, thereby achieving a desired electrical insulation between the remaining portions of increased lateral extension in the different height levels. Consequently, during the cutting process, not only are cut surface areas of the conductors exposed so as to actually form the corresponding communication pads, but also the corresponding communication pads at different height levels are electrically isolated from each other so as to allow individual operation of the communication pads positioned at different height levels.

In a further embodiment, a method further includes forming a plurality of conductors as respective metal traces at least two different height levels above the carrier substrate, and cutting through the plurality of conductors so as to provide a plurality of communication pads in the side surface. As already discussed above, a wiring system may be provided, for instance on the basis of a multi-level substrate, wherein at each level appropriate metal traces may be formed on the basis of well-established deposition techniques, thereby forming the metal traces in each device level with well-defined precision and shape. Hence, upon cutting through a corresponding metal trace, the cross-sectional area thereof forms the associated communication pad having well-defined shape and dimensions.

In a further embodiment, a method further includes forming a first metal trace as a first portion of the conductor at a first height level and a second metal trace as a second portion of the conductor at a second height level above the carrier substrate, forming a via so as to couple the first and second metal traces, and cutting through the via so as to provide the communication pad in a side surface. Hence, by applying any appropriate process technique for forming metal lines or traces in different device levels, the finally obtained cross-sectional area of the communication pad may be adjusted substantially independently of the cross-sectional areas of the metal lines in the individual device levels by providing a via that couples metal lines of two adjacent device levels. Consequently, the metal lines may establish the electrical connection to the resulting communication pad, and may form, in combination with the via, a significantly increased surface area of the communication pad compared to the cross-sectional area of the metal line alone.

Further illustrative embodiments may also be disclosed in the appended claims and in the following description.

BRIEF DESCRIPTION OF THE SEVERAL VIEWS OF THE DRAWINGS

FIG. 1 illustrates a cross-sectional view of an electronic system including packaged semiconductor devices, which have superior connectivity due to the implementation of a lateral wireless communication channel according to an embodiment.

FIG. 3A illustrates a top view of a composite block of packaged semiconductor devices, in which an appropriate conductive structure may be formed on the basis of deposition techniques, such as plating techniques, wherein a stacked configuration of communication pads may be obtained, according to an embodiment.

DETAILED DESCRIPTION

Figure 2A:
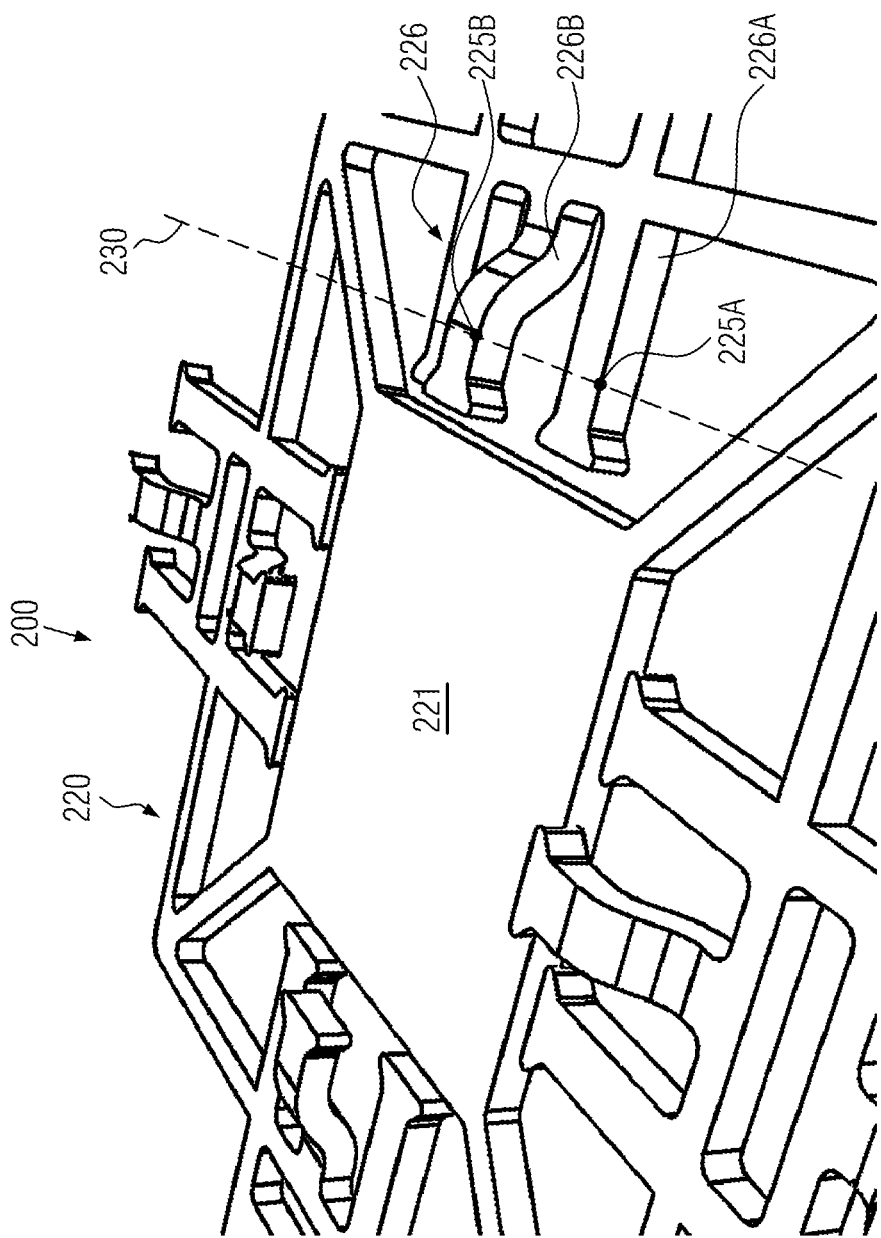
FIG. 2A illustrates a perspective view of a lead frame as a component of a packaged semiconductor device, in which conductors are provided that form, after cutting through the lead frame, corresponding communication pads, according to an embodiment.

As discussed above, one or more embodiments increase connectivity within an electronic system by providing packaged semiconductor devices, which have implemented therein a communication pad at a side surface in order to establish a lateral wireless communication with other components, such as other packaged semiconductor devices of the electronic system.

It should be appreciated that terms, such as "horizontal", "lateral", "vertical", "top, bottom, side", and the like, are to be understood as relative terms and not in an absolute sense. Hence, these terms are to be understood with reference to any appropriate reference system, for instance the substrate material of an electronic system, such as a PCB, to which may be attached a packaged semiconductor device on the basis of solder connections established between a package contact structure and a complementary contact structure of the PCB. In this context, the corresponding surface of the packaged semiconductor device including the package contact structure for coupling to the PCB may be considered as a bottom surface of the packaged semiconductor device. In this sense, a side surface of the packaged semiconductor device may be understood as a surface area that is substantially perpendicularly oriented with respect to the bottom surface.

Similarly, the terms "above, below, on" and similar terms may be understood as position information in relation to a reference, without indicating an absolute position or direction. In particular, an object positioned "above" a specified further object is to be understood as being positioned with orthogonal distance with respect to the specified further object, wherein two different height levels of the objects are determined, with the height level of the specified further object being less than the height level of the object that is positioned above the specified further object.

FIG. 1 illustrates a cross-sectional view of an electronic system 150 including a carrier substrate 151, such as a PCB, and the like, to which are attached a first packaged semiconductor device 100A and a second packaged semiconductor device 100B. The first and second packaged semiconductor devices 100A and 100B may differ in size and function or may have basically the same configuration, depending on the overall complexity of the electronic system 150. Furthermore, the electronic system 150 may include more than two packaged semiconductor devices. In the embodiment described, the first and second packaged semiconductor devices 100A, 100B are illustrated so as to have basically the same configuration so that corresponding components may be described with reference to the packaged semiconductor device 100A, while, however, it is to be understood that the components in the semiconductor device 100B may differ from those described with reference to the device 100A.

The packaged semiconductor device 100A may include a bottom substrate 102, which may thus define a bottom surface on which a package contact structure 103 is provided in order to mechanically and electrically couple to the carrier substrate 151. In this manner, reliable electrical and mechanical connections may be established from each of the packaged semiconductor devices to the carrier substrate 151 in accordance with the overall requirements of the electronic system 150. It is appreciated, however, that compared to a conventional electronic system, for a given horizontal surface area required for coupling the packaged semiconductor devices to the carrier substrate 151, a reduced connectivity may be sufficient, since package-to-package data exchange may be accomplished laterally or horizontally by means of a wireless signal exchange, as will be discussed later on in more detail. Furthermore, the packaged semiconductor devices 100A, 100B include an insulating material or dielectric material 101 so as to impart the required dielectric and mechanical characteristics to the packaged semiconductor devices. That is, the physical size and shape is substantially determined by the insulating material 101, wherein the substrate 102 may also be considered as a part of the insulating material 101.

Embedded in the insulating material 101 is a wiring system 104, which may be understood as any appropriate system of conductors establishing the electrical connection between one or more integrated-circuit chips 110 and the package contact structure 103. In the example described, the various interposers may be provided so as to couple to corresponding chip internal metallization systems and contact structures in the integrated circuit chips 110, which for convenience are illustrated in a very schematic manner. It is appreciated that the integrated-circuit chips 110A and 110B, as described relative to FIG. 1, are of illustrative nature only, and any other appropriate number of integrated-circuit chips, such as a single integrated-circuit chip, three integrated-circuit chips, or more than three integrated-circuit chips may be provided. As is well known, the one or more integrated-circuit chips 110 may include complex circuitry as is required for the desired functional behavior of the electronic system 150. Furthermore, according to an embodiment, at least one of the one or more integrated-circuit chips 110 include a communication circuit 111, for instance in the form of a transceiver/transponder circuit. It is understood that the communication circuit 111 may include different circuit portions, which may be configured to operate separately or in communication with each other, depending on the overall device requirements.

The communication circuit 111 is operatively coupled to one or more communication pads 125 formed at one or more side surfaces 101S of the packaged semiconductor devices. It is appreciated that in some illustrative embodiments, the communication pads 125 represent a part of the respective side surface 101S, which is to be understood such that the communication pads 125 have a surface that is substantially flush, slightly recessed, or slightly raised with respect to the surface area defined by the insulating material 101. Typically, the communication pads 125 are conductive surface areas that are substantially flush or even with the surface of the side surfaces 101S of the insulating material 101, since a corresponding cutting process may be applied so as to form the side surface 101S, as will be described later on in more detail. Moreover, it is appreciated that the communication pads 125 are thus corresponding surface portions of conductors or conductive portions which are embedded in the insulating material 101, except for the corresponding surface portion, herein referred to as communication pads.

In the embodiment described, the communication pads 125 are provided at different height levels, indicated by U and V, thereby imparting superior lateral connectivity to the packaged semiconductor devices. For example, the communication pads 125A, 125B are positioned at oppositely arranged side surfaces 101S at the height level U, while the communication pads 125C and 125D are positioned at the height level V. In the example described, the packaged semiconductor device 100B may also include the communication pads 125 so that the pads 125D and 125A of the device 100B may be aligned to the communication pads 125B and 125C, respectively of the packaged semiconductor device 100A. In this manner, the communication pads may allow a capacitive coupling so as to provide for wireless signal exchange between the semiconductor devices 100A and 100B. Moreover, in the embodiment described, a dielectric material 113 may be provided between the complementary communication pads, so that the size and shape of the communication pads in combination with the characteristics of the dielectric material 113 and the lateral distance between the communication pads determine the resulting capacitive coupling. Hence, an efficient wireless communication channel is established in a lateral direction L, while the vertical connection may be established by the wired contact structure 103, for instance with respect to the power supply, and the like.

It is appreciated that the respective wireless signal exchange may be accomplished individually for each communication pad so as to provide for increased lateral communication capabilities in the electronic system 150, wherein not necessarily each integrated-circuit chip may have a corresponding communication circuit 111. For example, as illustrated for the communication pads 125B and 125A, a connection may be established by bond wires 112 to the integrated circuit chip 110A, wherein a corresponding bond pad may be coupled with the communication circuit 111 provided in the integrated circuit chip 110B by the internal wiring system 104. Nevertheless, the circuit 111 may be appropriately configured so as to establish independent communication channels on the basis of the individual communication pads.

Various embodiments for implementing the communication pads in packaged semiconductor devices, such as the devices 100A, 100B, may be described with reference to FIGS. 2 to 4.

FIG. 2A illustrates a perspective view of a portion of a packaged semiconductor device 200, wherein the portion is provided in the form of a lead frame 220. As shown, the lead frame 220 includes a base plate 221, which is appropriately shaped and dimensioned in order to receive an integrated-circuit chip. It is appreciated that although a substantially square-shaped base plate is shown in FIG. 2A, any other appropriate geometric configuration may be selected, depending on the geometric configuration of the integrated-circuit chip to be incorporated into the packaged semiconductor device 200. The lead frame 220 includes an appropriate structure so as to mechanically determine the position of one or more of conductors 226, which, after being cut, as indicated by a cutting line 230, form a corresponding surface that acts as a respective communication pad. For example, a conductor 226A may form, after being cut, a communication pad 225A having a size and position that is determined by the configuration and position of the conductor 226A within the lead frame 220. Similarly, a communication pad 225B is formed after cutting through the conductor 226B. In the example described, the conductors 226A, 226B are formed such that two different height levels for the associated communication pads 225A, 225B are obtained. For example, the conductor 226B is bent after forming the lead frame 220, for instance by stamping a sheet of an appropriate conductive material, such as copper, aluminum, and the like. For example, the lead frame may have a thickness in an approximate range of 100 to 300 µm.

The packaged semiconductor device 200 may then be completed by attaching an integrated-circuit chip (not shown) to the base plate 221, which may thus also act as an efficient heat sink for the integrated-circuit chip. The attachment may be accomplished on the basis of any well-established technique. Thereafter, the conductors 226 may be coupled with the integrated-circuit chip so as to establish a functional connection between a communication circuit and the conductors 226. To this end, the wire-bond technique may be used, as is for instance also shown in FIG. 1. It is appreciated that the one or more integrated-circuit chips to be provided in the device 200 may have a similar configuration as is also discussed above with reference to FIG. 1 when referring to the one or more integrated-circuit chips 110. For example, in order to efficiently contact the conductors 226, respective increased end portions may be provided, as for instance shown in FIG. 2A. After attaching the one or more integrated-circuit chips and providing any other internal wiring system, as is also discussed above with reference to the device 100, an insulating material in the form of a mold material may be applied, as is also well known in the art. Hence, after forming the insulating material, the resulting block may be cut, for instance by any appropriate sawing technique, and the like, as is for instance indicated by the line 230, the corresponding mold material, as well as the conductors 226, are cut through, thereby forming a side surface and the communication pads 225A, 225B positioned therein.

Figure 2B:
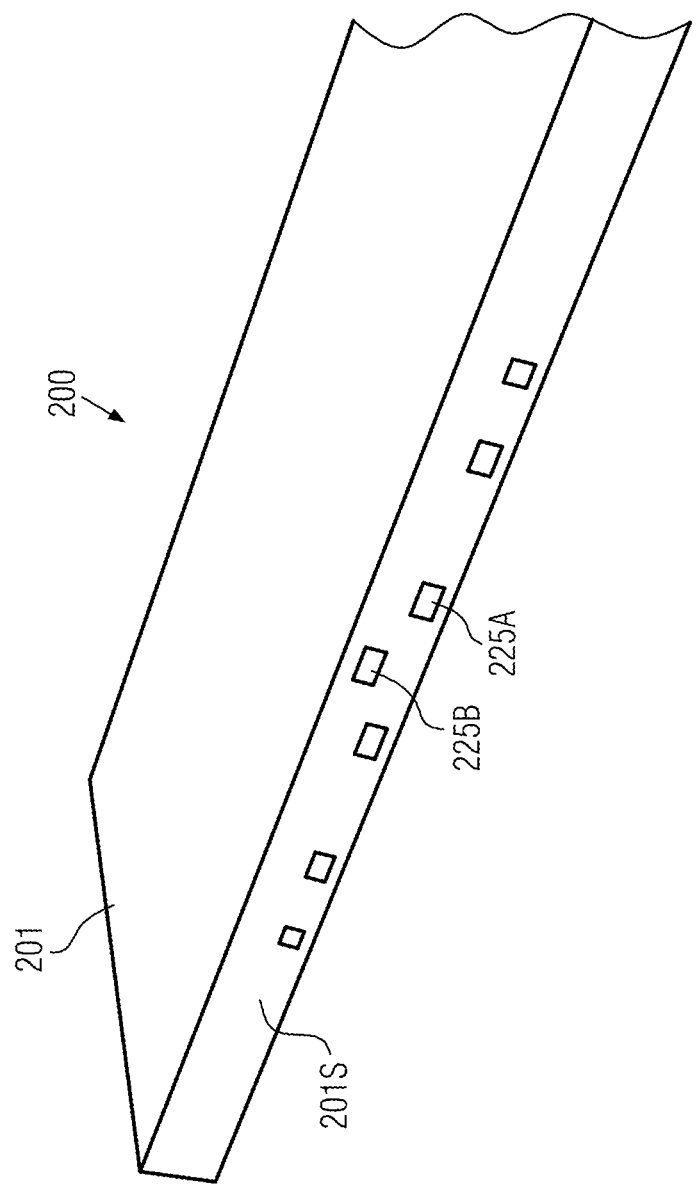
FIG. 2B illustrates a perspective view of a packaged semiconductor device, in which a side surface thereof includes stacked communication pads usable for establishing a wireless communication channel, according to an embodiment.

FIG. 2B illustrates a perspective view of the packaged semiconductor device 200 after the above-described process sequence. Hence, the insulating material 201 has embedded therein one or more integrated circuit chips, such as the one or more integrated circuit chips 110, the lead frame 220 as shown in FIG. 2A, a corresponding internal wiring system (not shown), such as the system 104, and the cut conductors 226, which provide the communication pads 225A, 225B positioned at two different height levels on the side surfaces 201S.

Figure 2C:
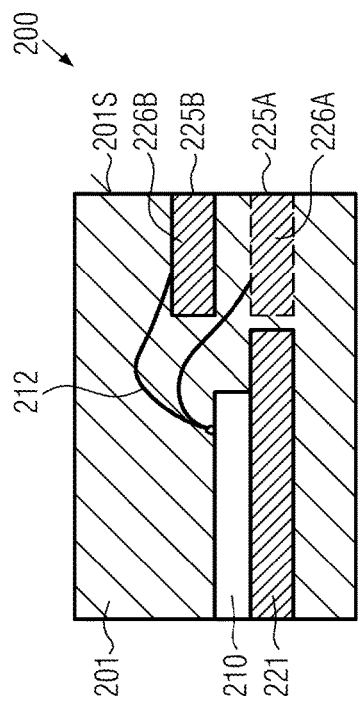
FIG. 2C illustrates a cross-sectional view of a packaged semiconductor device formed on the basis of a stacked configuration of communication pads, which are obtained as shown in FIG. 2A, according to an embodiment.

FIG. 2C illustrates a cross-sectional view of the packaged semiconductor device 200, wherein an integrated circuit chip 210 is positioned above the base plate 221 and is operatively coupled to the conductors 226A, 226B and thus to the communication pads 225A, 225B on the basis of wire bond connections 212.

Figure 2D:
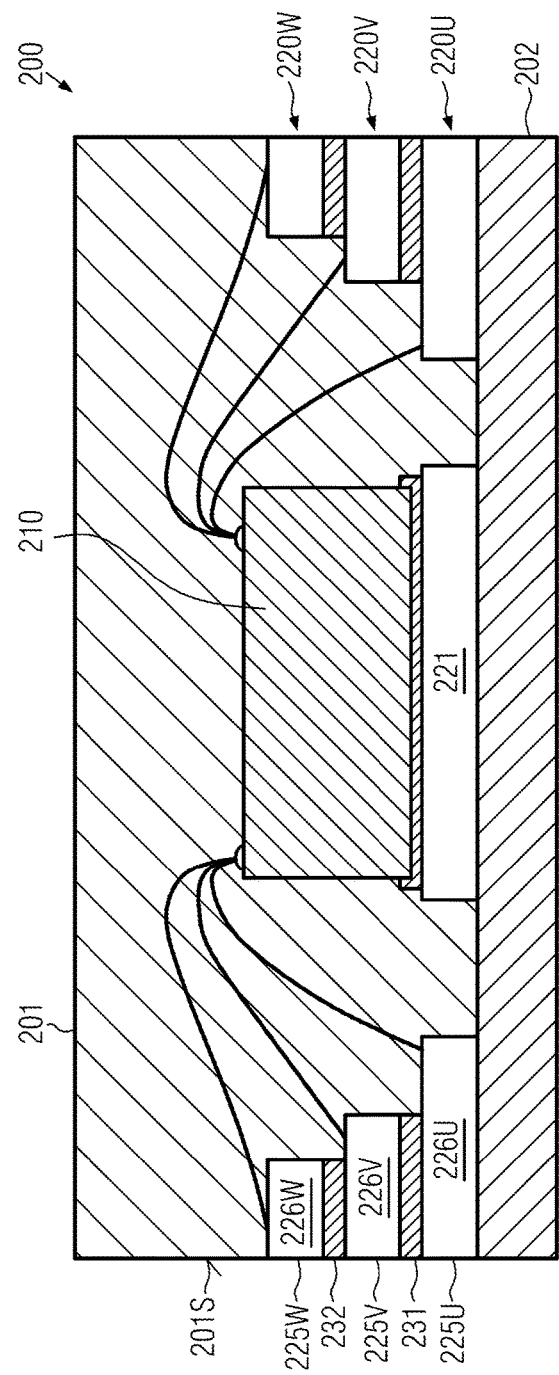
FIG. 2D illustrates a packaged semiconductor device including a gate-stack lead-frame configuration, thereby providing corresponding communication pads at different height levels of the packaged device, according to an embodiment.

FIG. 2D illustrates a cross-sectional view of the packaged semiconductor device 200 according to a further embodiment, in which the communication pads may be provided on different height levels, which may be obtained by stacking two or more lead frames over the substrate 202. As shown, a first lead frame 220U, which may include the base plate 221, may be provided so as to include conductors 226U, which in turn forms a communication pad 225U in the side surface 201S of the insulating material 201. A further lead frame 220V is positioned above the lead frame 220U with an insulating material 231 positioned in between. Similarly, a further lead frame 220W is positioned above the lead frame 220V with a further insulating material 232 providing for an electrical isolation. Hence, the lead frame 220V provides conductors 226V and thus communication pads 225V, while the lead frame 220W provides conductors 226W and thus communication pads 225W. Hence, the individual lead frames may be formed on the basis of well-established techniques with appropriately adapted size and configuration in order to provide the corresponding conductors and thus communication pads upon cutting the insulating material 201. In this manner, a desired number of height levels with corresponding communication pads may be provided without requiring a modification of conventional manufacturing techniques for fabricating lead frames. For example, the lead frames may have a thickness in an approximate range of 100 to 200 µm, while the intermediate insulating materials 231, 232 may have a thickness in an approximate range of 5 to 100 µm.

In a variation, the base plate 221 may be absent, and then the integrated-circuit chip 210 can be attached to the substrate 202 using, for example, glue.

It is appreciated that an appropriate system of conductors may be formed on the basis of many other process techniques, such as sophisticated metal deposition processes, so that conductors may be formed with appropriate cross-sectional shape and dimensions at appropriate positions in order to obtain, upon cutting the conductor system after molding a corresponding block, the required communication pads positioned at respective side surfaces.

FIG. 3A illustrates a top view of a composite block 300G of packaged semiconductor devices 300A, 300B, which are appropriately configured so as to provide wireless lateral communication capabilities after cutting the blocks 300G in order to obtain individual packaged semiconductor devices. As shown, the block 300G includes respective base plates 321, which may appropriately be configured in order to receive one or more integrated-circuit chips, depending on the overall device requirements. Furthermore, conductors 326U, 326V may be positioned with appropriate size adjacent to the base plate 321 so as to obtain after cutting the block 300G according to a cutting line 330 the corresponding communication pads. In the embodiment described, the conductors 326U, 326V are provided as a stacked configuration with an intermediate conductor 327, which has an appropriate width 327W that is less than a width 330W of the cutting line 330. On the other hand, the conductors 326U, 326V have a lateral extension that is greater than the width 330W so as to ensure that after a cutting through the conductors still a portion thereof will be preserved, while on the other hand, the intermediate conductor 327 will be completely removed. Furthermore, in the embodiment described, the lateral extension of the conductor 326U is greater than the lateral extension of the conductor 326V, thereby ensuring superior accessibility upon performing a wire bond process.

Figure 3B:
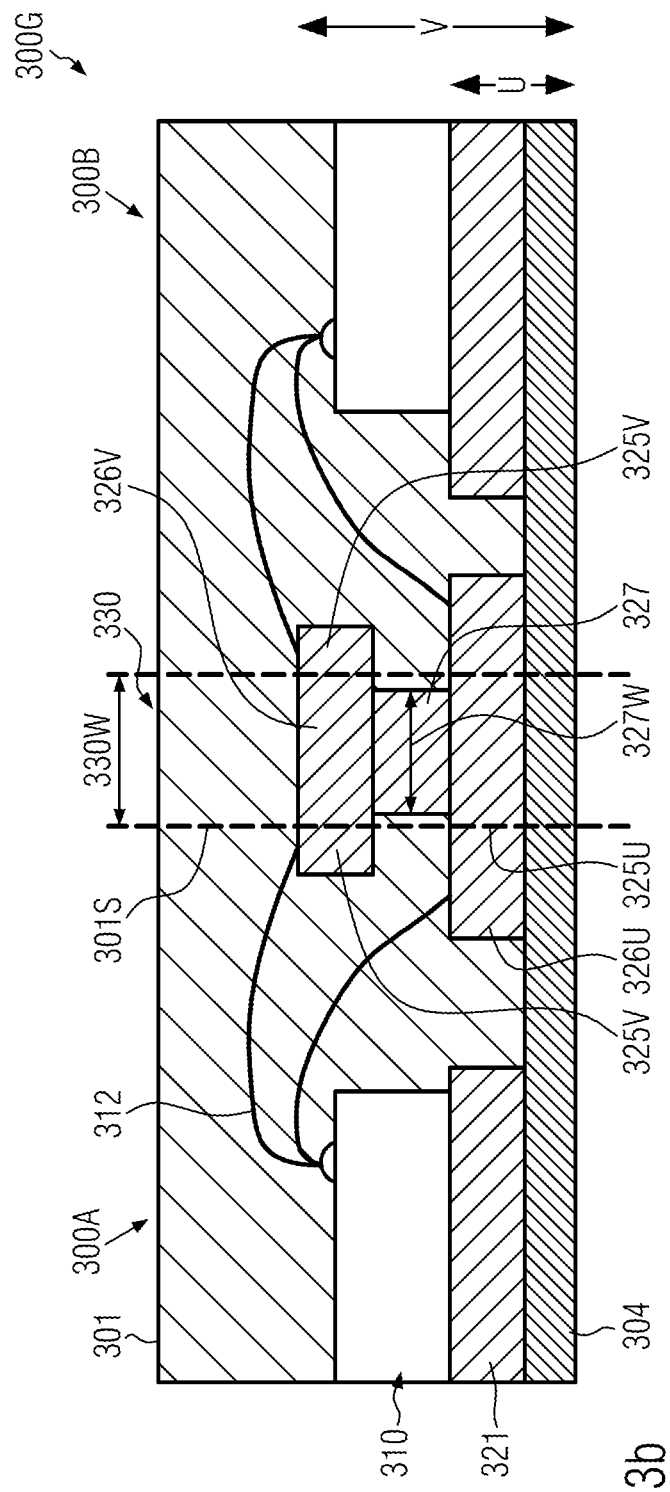
FIGS. 3B and 3C illustrate cross-sectional views of the composite block of packaged semiconductor devices after providing a mold material and prior to actually cutting the composite block so as to obtain individual packaged semiconductor devices, according to an embodiment.

FIG. 3B schematically illustrates a cross-sectional view (IIIb,IIIc) of the block 300G according to an embodiment. As shown, respective circuit chips 310 are positioned above the corresponding base plates 321 and the conductor formed from the conductors 326U, 327 and 326V is positioned between respective base plates 321. Thus, the conductor 326U defines a first height level U, while the conductor 326V defines a second height level V, while the intermediate conductor 327 is completely eliminated upon cutting the block 300G, as illustrated by the sawing line 330. Consequently, upon cutting through the material 301 and the conductors, thereby forming a side surface 301S, a communication pad 325U at the lower height level and a communication pad 325V at the higher height level are formed. Furthermore, due to the different lateral extensions of the initial conductors 326U and 326V, appropriate accessibility is achieved in order to couple these conductors with the circuit chip 310 on the basis of a wire-bond connection 312.

Figure 3C:
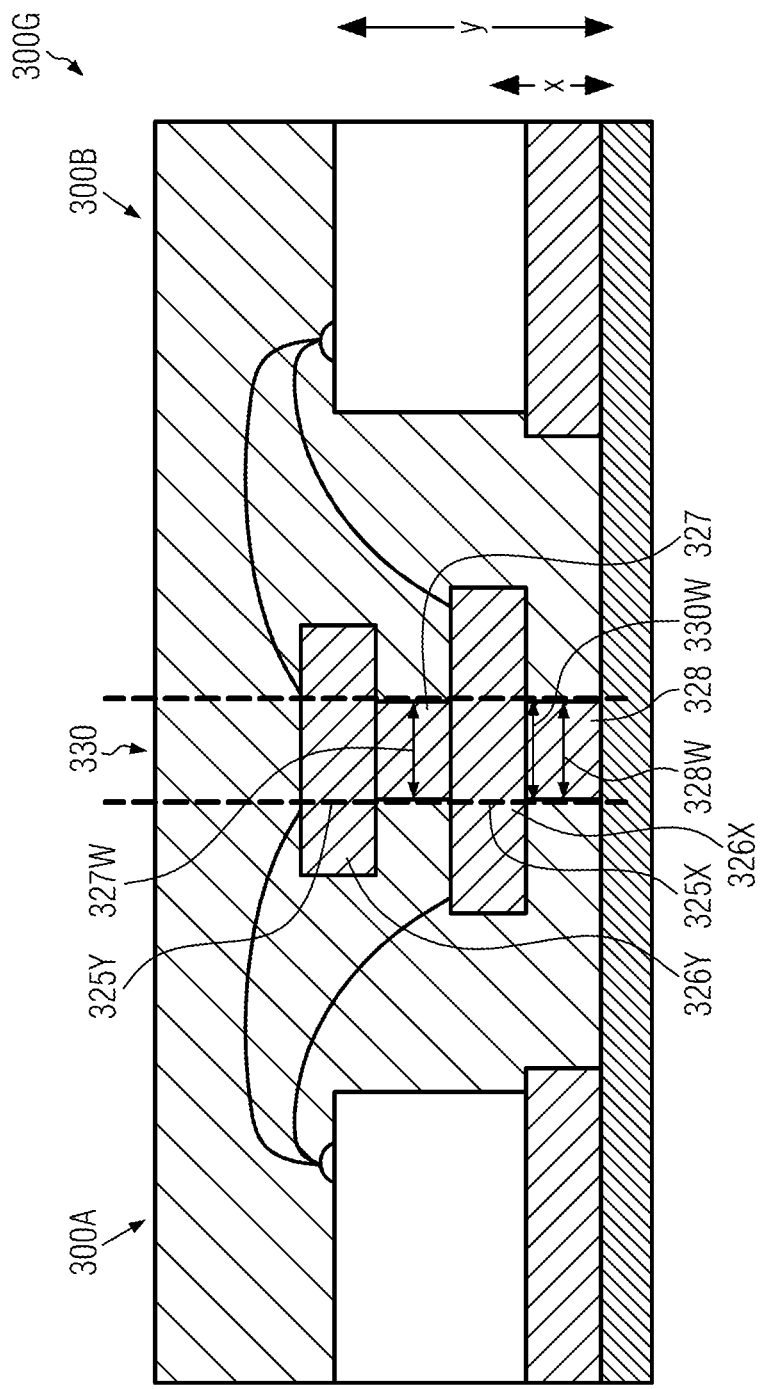

FIG. 3C illustrates a cross-sectional view of the block 300G according to a further embodiment. In this case, different height levels X and Y are obtained by incorporating a further intermediate conductor 328 having an appropriate width 328W that ensures complete elimination of the conductor 328 upon cutting through the block 300G. Hence, a conductor 326Y is positioned above the conductor 328, followed by the intermediate conductor 327, which in turn is followed by a conductor 326X. Hence, upon forming the side surface upon cutting through the block 300G, communication pads 325Y and 325X are formed at corresponding height levels.

It is appreciated that more than two effective height levels may be implemented by providing a corresponding number of stacked conductors with respective intermediate conductors of reduced width, if required in terms of increasing the lateral communication capabilities of the packaged semiconductor devices 300A, 300B.

Generally, the conductors 326 and the corresponding base plates 321 may be formed on the basis of well-established deposition techniques, such as plating of metal materials, for instance applying appropriate masking regimes in order to define the lateral size and shape of corresponding conductors. For example, an appropriate mask may be formed on a carrier substrate 304, for instance by using the resist material, and the like, followed by the deposition of any appropriate conductive material, for instance using electroless plating techniques or electroplating, depending on the overall requirements. Thereafter, the mask of a further level may be formed by well-established lithography techniques, followed by a further deposition of a conductive material, and this sequence may be repeated so as to obtain a desired number of levels, each level having appropriately dimensioned conductors. Thereafter, the mask material may be removed by well-established techniques, and the integrated-circuit chips may be attached to the respective base plates by using any appropriate packaging technique. It is appreciated that if required, the carrier substrate 304 may be removed and may be used for any further packaging processes. Consequently, highly complex conductor systems may be established, for instance also implementing at least a part of the package internal wiring system, while still providing for a high degree of accuracy and reproducibility due to the characteristics of the deposition and patterning processes involved. For example, the various levels may be formed with a thickness in an approximate range of 50 to 100 μm, thereby ensuring precisely defined communication pads.

Figure 4A:
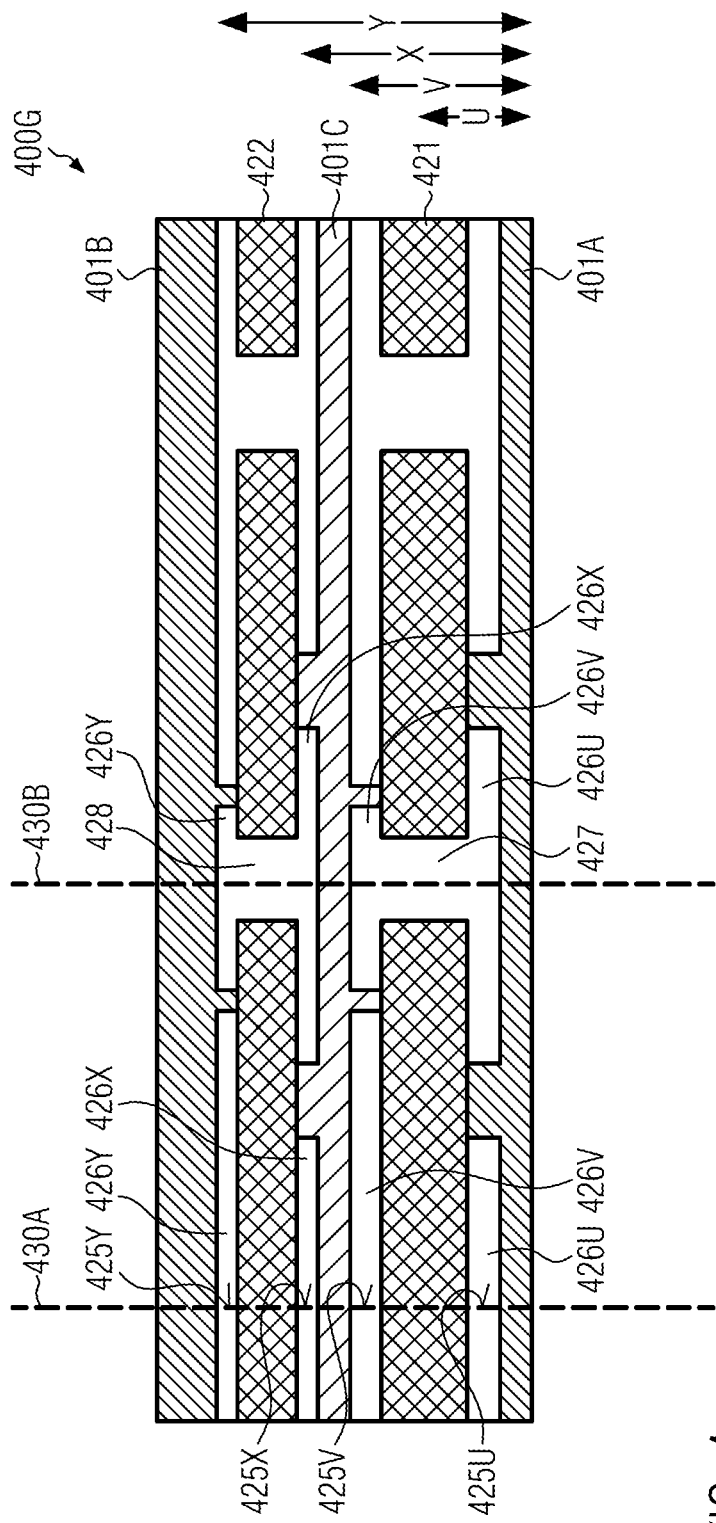
FIG. 4A illustrates a cross-sectional view of a composite block of packages including a multi-level substrate including a plurality of metal traces, which, upon cutting through the composite block, may form communication pads at side surfaces of the resulting packaged semiconductor devices, according to an embodiment.

FIG. 4A illustrates a cross-sectional view of a composite block 400G of packaged semiconductor devices in a manufacturing stage prior to separating individual packaged semiconductor devices. In these embodiments, also several metallization levels may be realized on the basis of appropriate deposition and patterning techniques in order to form metal traces or metal lines in an appropriate insulating material, such as dielectric substrates in combination with additional dielectric materials as are typically used in packaging techniques.

As shown, the block 400G includes a dielectric material or insulating material in the form of a layer 401A, and intermediate dielectric material 401C and a layer 401B. Moreover, respective base plates 421, 422, for instance in the form of respective substrates, may be provided at different height levels. Furthermore, at each side of the base plates or substrates 421, 422, a respective metallization layer is provided, thereby forming conductors 426U at a height level U, conductors 426V at a height level V, conductors 426X at a height level X, and conductors 426Y at a height level Y. As shown, the conductors 426V and 426X are electrically separated by the dielectric material 401C. Similarly, the conductors 426Y are covered by the dielectric material 401B, while the conductors 426U are covered (on the bottom) by the dielectric material 401A.

Furthermore, in some embodiments, the metal traces of two adjacent metallization levels formed on a corresponding base plate or substrate 421 and 422, respectively, may be coupled by a via 428 and 427, respectively. That is, in the example shown, the conductor 426U and the conductor 426V are coupled by the via 427, while the conductors 426X and 426Y are coupled by the via 428.

The block 400G may be formed on the basis of any well-established deposition and patterning strategies, for instance by providing the substrate 421 and forming on both subset surfaces thereof an appropriate wiring system so as to obtain the desired conductors. Similarly, appropriate metal traces and thus an appropriate wiring system may be formed on both sides of the base plate 422, wherein well-established lithography and deposition techniques may be used. The correspondingly processed substrates may be bonded so as to obtain the structure as shown in FIG. 4A. It is appreciated that the number of height levels may be adjusted in accordance with the overall device requirements, by reducing or increasing the number of substrates used for forming the block 400G. Hence, any appropriate process technique for forming multi-layer substrates may be used, wherein the corresponding metallization levels are configured such that respective communication pads may be obtained upon separating the block 400G into individual devices.

As shown in FIG. 4A, communication pads 425U, 425V, 425X, 425Y may be formed upon cutting through the block 400G as indicated by a cutting line 430A. In this manner, four different height levels for the communication pads may be implemented, wherein the sizes of the resulting communication pads are determined by the cross-sectional areas of the respective conductors 426U, 426V, 426X, and 426Y. In other illustrative embodiments, as indicated by the cutting line 430B, an increased size of the resulting communication pads may be obtained, since the cutting line 430B extends through the vias 428 and 427, which thus determine in combination with the cross-sectional areas of the corresponding conductors the finally obtained size of the communication pads.

Figure 4B:
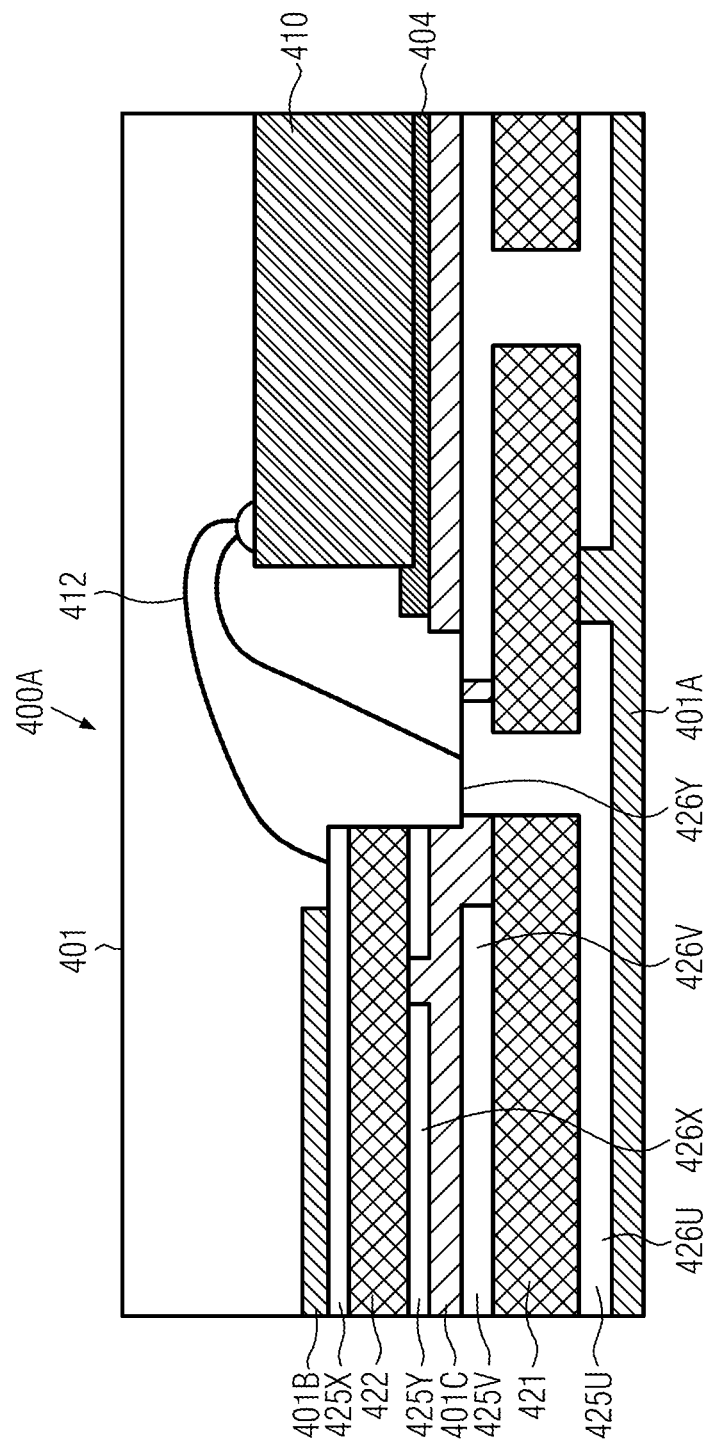
FIGS. 4B and 4C illustrate cross-sectional views of individual packaged semiconductor devices obtained on the basis of two different variants of FIG. 4A, according to an embodiment.

FIG. 4B illustrates a cross-sectional view of the packaged semiconductor device 400A, when formed in accordance with the alternative as indicated in FIG. 4A by the cutting line 430A, according to an embodiment. As shown, the device 400A includes a mold material 401, which in combination with the materials 401B, 401C, and 401A represents an insulating or dielectric material of the packaged semiconductor device. Furthermore, an integrated-circuit chip 410 may be attached above the base plate 421 and may be coupled on the basis of any appropriate contact regime by means of a wiring system 404, which is only illustrated in a simplified manner. Furthermore, wire-bond connections 412 may operatively couple at least some of the conductors 426U, 426V, 426X, and 426Y with the integrated-circuit chip 410. Hence, by cutting the block 400G in accordance with the option as indicated by the cutting line 430A of FIG. 4A, the communication pads 425U, 425V, 425X, and 425Y are obtained at the respective height levels, wherein the sizes of the communication pads are determined by the cross-sectional sizes of the associated conductors. For example, the communication pads may have heights in an approximate range of 30 to 50 µm, i.e., the thickness of the corresponding metal traces or conductors may be approximately 30 to 50 µm. The widths of the communication pads, i.e., the dimension in the direction perpendicular to the drawing plane of FIG. 4B, may be in the approximate range of 50 to 100 µm. It is appreciated, however, that any other dimensions may readily be realized upon appropriately modifying the corresponding manufacturing process. In a variation not shown, instead of using wire-bond connection 412, one may use solder bump or any other connection techniques to couple at least some of the conductors 426U, 426V, 426X, and 426Y with the integrated-circuit chip 410, also by means of a wiring system 404.

Figure 4C:
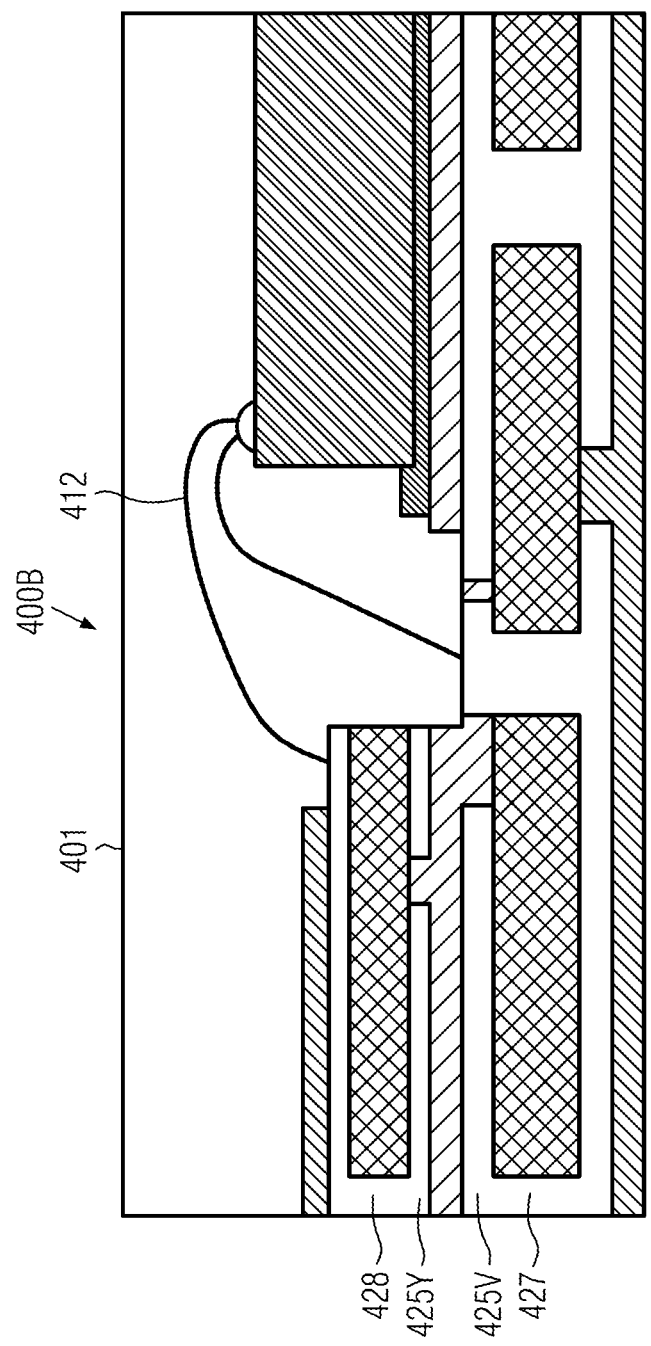

FIG. 4C illustrates a cross-sectional view of the packaged semiconductor device 400B formed in accordance with the option as indicated by the cutting line 430B in FIG. 4A, according to an embodiment. As shown, the device 400B includes a communication pad 425V that is a flat surface of the via 427 so that significantly increased dimensions of the communication pad may be obtained, even if the same design rules are applied as in the embodiment described with reference to FIG. 4B. For example, a width of the communication pad 425V may be in an approximate range of 100 to 200 µm, and a height thereof may be in an approximate range of 100 to 200 µm. Hence, for a given technology used to form the multi-layered substrate of the block 400G, an increased size of the resulting communication pads may be obtained at the cost of a reduced number of stacked communication pads. It is appreciated, however, that differently sized communication pads and thus a different number of communication pads and height levels may be implemented by combining the two options indicated in FIG. 4A at different sides of a corresponding packaged device.

As a result, described above are embodiments of methods of forming packaged semiconductor devices and corresponding devices and electronic systems, in which a horizontal or vertical wireless communication between adjacently positioned packaged semiconductor devices may be accomplished on the basis of appropriately aligned communication pads, which are internally operatively coupled to a communication circuit. It is appreciated that the various features of the embodiments described above with reference to FIGS. 1 to 4C may appropriately be exchanged, depending on the overall device requirements. Furthermore, a package semiconductor device may be coupled to one or more other packaged semiconductor devices, or with one or more other components (e.g., integrated circuits and computing apparati such as microprocessors and microcontrollers) to form a system, such as, e.g., a computing system or smart phone.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A method of forming a packaged semiconductor device, the method comprising:
    forming a block of insulating material having embedded therein an integrated circuit chip and a wiring system coupled to the integrated-circuit chip, the integrated-circuit chip including a communication circuit operatively coupled to a conductor extending in the block of insulating material; and
    cutting the block of insulating material through the conductor to form a side surface of the packaged semiconductor device and expose a cut surface of the conductor only on the side surface as a first communication pad for wireless signal exchange, wherein the conductor is formed so as to have a first lateral extension at a first height level and a second lateral extension at a second height level, wherein the first lateral extension is greater than the second lateral extension.

2. The method of claim 1, wherein forming the block of insulating material includes providing a lead frame, coupling at least one conductor branch of the lead frame with the communication circuit, and embedding the lead frame in the block of insulating material.

3. The method of claim 2, further comprising bending the at least one conductor branch so as to adjust a height level of the first communication pad.

4. The method of claim 3, further comprising coupling a second conductor branch of the lead frame with the communication circuit and using the second conductor branch so as to define a second height level for a second communication pad in the side surface.

5. The method of claim 4, further comprising positioning at least one further lead frame above the lead frame so as to form a stacked configuration.

6. The method of claim 1, further comprising forming the conductor on a carrier substrate by a plating process.

7. The method of claim 1, wherein the second lateral extension is less than a width of a cut line formed in the block of insulating material when cutting the block and the conductor.

8. A method of forming a packaged semiconductor device, the method comprising:
    forming a block of insulating material having embedded therein an integrated circuit chip and a wiring system coupled to the integrated-circuit chip, the integrated-circuit chip including a communication circuit operatively coupled to a conductor extending in the block of insulating material;
    cutting the block of insulating material through the conductor to form a side surface of the packaged semiconductor device and expose a cut surface of the conductor only on the side surface as a first communication pad for wireless signal exchange;
    forming a plurality of conductors in the block of insulating material as respective metal traces at two or more different height levels above a substrate of the packaged semiconductor device; and
    cutting through the plurality of conductors so as to provide a plurality of communication pads in the side surface.

9. The method of claim 8, wherein forming the block of insulating material comprises:
    providing a lead frame including a plurality of conductor branches;
    coupling at least one conductor branch of the lead frame with the communication circuit; and
    encapsulating the lead frame in the block of insulating material.

10. The method of claim 9, further comprising deforming the at least one conductor branch to adjust a height level of the first communication pad.

11. The method of claim 10, further comprising:
coupling another one of the at least one conductor branches of the lead frame with the communication circuit; and
defining a second height level for a second communication pad in the side surface with the second conductor branch.

12. The method of claim 11, further comprising positioning at least one further lead frame above the lead frame to form a stacked configuration.

13. The method of claim 8, further comprising attaching the semiconductor package device to a carrier substrate by a plating process.

14. A method of forming a packaged semiconductor device, the method comprising:
forming a block of insulating material having embedded therein an integrated circuit chip and a wiring system coupled to the integrated-circuit chip, the integrated-circuit chip including a communication circuit operatively coupled to a conductor extending in the block of insulating material;
cutting the block of insulating material through the conductor to form a side surface of the packaged semiconductor device;
forming a first metal trace as a first portion of the conductor at a first height level and a second metal trace as a second portion of the conductor at a second height level above a substrate of the packaged semiconductor device; and
forming a via so as to couple the first and second metal traces; and
cutting through the block of insulating material, the first metal trace, the second metal trace, and the via to provide communication pads on the side surface.

15. The method of claim 14, wherein forming the block of insulating material comprises:
providing a lead frame including a plurality of conductor branches;
coupling at least one conductor branch of the lead frame with the communication circuit; and
embedding the lead frame in the block of insulating material.

16. The method of claim 15, further comprising bending the at least one conductor branch to adjust a height level of the first communication pad.

17. The method of claim 16, further comprising:
coupling another one of the at least one conductor branches of the lead frame to the communication circuit; and
defining a second height level for a second communication pad in the side surface with the second conductor branch.

18. The method of claim 14, further comprising positioning at least one further lead frame above the lead frame to form a stacked configuration.

19. The method of claim 14, wherein cutting through the block of insulating material, the first metal trace, the second metal trace, and the via comprises providing the communication pads coplanar with the side surface.

* * * * *